(12) United States Patent
Igarashi et al.

(10) Patent No.: US 11,034,864 B2
(45) Date of Patent: Jun. 15, 2021

(54) ADHESIVE FILM HAVING ADHESIVE RESIN LAYERS AND METHOD OF MANUFACTURING ELECTRONIC APPARATUS USING THE ADHESIVE FILM

(71) Applicant: MITSUI CHEMICALS TOHCELLO, INC., Tokyo (JP)

(72) Inventors: Kouji Igarashi, Duesseldorf (DE); Jin Kinoshita, Nagoya (JP); Hiroyoshi Kurihara, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 16/478,614

(22) PCT Filed: Jan. 17, 2018

(86) PCT No.: PCT/JP2018/001271
§ 371 (c)(1),
(2) Date: Jul. 17, 2019

(87) PCT Pub. No.: WO2018/135546
PCT Pub. Date: Jul. 26, 2018

(65) Prior Publication Data
US 2020/0048501 A1     Feb. 13, 2020

(30) Foreign Application Priority Data

Jan. 20, 2017   (JP) .............................. JP2017-008618

(51) Int. Cl.
*H01L 21/00*      (2006.01)
*C09J 7/24*       (2018.01)
(Continued)

(52) U.S. Cl.
CPC ................. *C09J 7/243* (2018.01); *C09J 7/35* (2018.01); *C09J 11/06* (2013.01); *C09J 201/00* (2013.01);
(Continued)

(58) Field of Classification Search
CPC ..... C09J 7/243; C09J 7/35; C09J 11/06; C09J 201/00; C09J 2301/412; C09J 2203/326;
(Continued)

(56) References Cited

U.S. PATENT DOCUMENTS 6,506,868 B1 *  1/2003  Goda ....................... C08G 8/28
                                                      525/393
7,691,225 B2 *  4/2010  Kishimoto ................ C09J 7/29
                                                      156/325
(Continued)

FOREIGN PATENT DOCUMENTS

EP   1 944 345 A1    7/2008
EP   2 666 834 A1   11/2013
(Continued)

OTHER PUBLICATIONS

International Search Report (PCT/ISA/210) and translation and Written Opinion (PCT/ISA/237) dated Mar. 27, 2018, by the Japanese Patent Office as the International Searching Authority for International Application No. PCT/JP2018/001271.
(Continued)

*Primary Examiner* — Caleb E Henry
(74) *Attorney, Agent, or Firm* — Buchanan Ingersoll & Rooney PC

(57) ABSTRACT

An adhesive film used when sealing an electronic component to temporarily fix the electronic component, the adhesive film including a base material layer, an adhesive resin layer which is provided on a first surface side of the base material layer and which is for temporarily fixing the
(Continued)

electronic component, and an adhesive resin layer which is provided on a second surface side of the base material layer and of which the adhesive strength decreases according to an external stimulus, in which the adhesive resin layer includes a polyvalent carboxylic acid ester-based plasticizer and an adhesive resin, and a content of the polyvalent carboxylic acid ester-based plasticizer in the adhesive resin layer is more than or equal to 0.7 parts by mass and less than or equal to 50 parts by mass with respect to 100 parts by mass of the adhesive resin included in the adhesive resin layer.

5 Claims, 3 Drawing Sheets

(51) Int. Cl.
  *C09J 7/35* (2018.01)
  *C09J 11/06* (2006.01)
  *C09J 201/00* (2006.01)
  *H01L 21/02* (2006.01)
  *H01L 23/00* (2006.01)

(52) U.S. Cl.
  CPC ........ *H01L 21/02304* (2013.01); *H01L 24/27* (2013.01); *H01L 24/94* (2013.01); *C09J 2203/326* (2013.01); *C09J 2301/412* (2020.08); *C09J 2423/04* (2013.01)

(58) Field of Classification Search
  CPC .. C09J 2423/04; C09J 133/06; C09J 2433/00; C09J 2301/502; C09J 2301/408; C09J 2301/1242; C09J 7/30; C09J 133/04; C09J 133/10; C09J 7/20; C09J 2301/124; C08K 5/11; C08K 5/0016; C08K 5/12; B32B 27/00; H01L 21/56; H01L 21/02304; H01L 24/27; H01L 24/94; H01L 2224/12105; H01L 2224/96
  See application file for complete search history.

(56) References Cited

U.S. PATENT DOCUMENTS

| | | | |
|---|---|---|---|
| 8,436,481 B2 | 5/2013 | Hoshino et al. | |
| 8,502,397 B2 | 8/2013 | Yanagi et al. | |
| 9,822,284 B2 | 11/2017 | Usugi et al. | |
| 2005/0228079 A1* | 10/2005 | Fujiki | C08L 61/06 523/402 |
| 2010/0047567 A1* | 2/2010 | Souriau | H01L 21/6835 428/339 |
| 2010/0167469 A1* | 7/2010 | Chino | H01L 23/3107 438/124 |
| 2011/0143552 A1 | 6/2011 | Yanagi et al. | |
| 2011/0151625 A1 | 6/2011 | Hoshino et al. | |
| 2014/0004658 A1* | 1/2014 | Priewasser | H01L 21/561 438/118 |
| 2016/0168422 A1* | 6/2016 | Iwai | C09D 125/06 428/339 |
| 2016/0190512 A1* | 6/2016 | Chida | H01L 51/003 257/40 |
| 2016/0208144 A1 | 7/2016 | Usugi et al. | |
| 2016/0264825 A1* | 9/2016 | Ukei | C09J 7/22 |
| 2016/0351539 A1* | 12/2016 | Bower | H01L 25/0655 |
| 2017/0173925 A1* | 6/2017 | Pietambaram | H01L 21/481 |

FOREIGN PATENT DOCUMENTS

| | | |
|---|---|---|
| JP | 2011129649 A | 6/2011 |
| JP | 2011134811 A | 7/2011 |
| JP | 2015-168711 A | 9/2015 |
| WO | 2015029871 A1 | 3/2015 |

OTHER PUBLICATIONS

The Extended European Search Report dated Sep. 1, 2020, by the European Patent Office in corresponding European Patent Application No. 18741559.1. (8 pages).

* cited by examiner

ADHESIVE FILM HAVING ADHESIVE RESIN LAYERS AND METHOD OF MANUFACTURING ELECTRONIC APPARATUS USING THE ADHESIVE FILM

TECHNICAL FIELD

The present invention relates to an adhesive film and a method of manufacturing an electronic apparatus.

BACKGROUND ART

A fan-out type wafer level package (WLP) is being developed as a technology capable of reducing the size and weight of electronic apparatuses (for example, semiconductor apparatuses).

In an Embedded Wafer Level Ball Grid Array (eWLB) which is one method of manufacturing a fan-out type WLP, a method is adopted in which temporary fixing is carried out in a state where a plurality of electronic components such as semiconductor chips are separated on an adhesive film attached to a support substrate, and the plurality of electronic components are collectively sealed with a sealing material. Here, it is necessary to fix the adhesive film to the electronic component and the support substrate in a sealing step or the like, and, after sealing, it is necessary to remove the adhesive film from the support substrate and the sealed electronic components.

Examples of such a technique relating to a method of manufacturing such a fan-out type WLP include the technique described in Patent Document 1 (Japanese Patent Laid-Open No. 2011-134811).

Patent Document 1 discloses a heat-resistant adhesive sheet for manufacturing a semiconductor apparatus, which is used by being adhered when resin sealing a substrate-less semiconductor chip, in which the heat-resistant adhesive sheet has a base material layer and an adhesive layer, and the adhesive layer is a layer which has an adhesive strength with respect to SUS 304 after bonding of more than or equal to 0.5 N/20 mm and which is cured by a stimulus received by the time a resin sealing step is completed such that the package peeling strength is less than or equal to 2.0 N/20 mm.

RELATED DOCUMENT

Patent Document

[Patent Document 1] Japanese Patent Application Publication No. 2011-134811

SUMMARY OF THE INVENTION

Technical Problem

According to the investigations of the present inventors, it is clear that, when an electronic component is arranged on an adhesive film, the electronic component is sealed with a sealing material, and then the adhesive film is peeled from the electronic component, a part (also referred to below as glue) of the adhesive resin layer of the adhesive film on the electronic component side may remain (also referred to below as glue residue), and, in particular, that the use of a granular sealing resin is likely to leave glue residue.

The present invention was made in view of the above circumstances and provides an adhesive film for temporarily fixing electronic components which is able to suppress glue residue on the side of the electronic components when peeling an adhesive film from electronic components.

Solution to Problem

The present inventors carried out intensive research to achieve the above object. As a result, it was found that, in an adhesive film provided with a base material layer, an adhesive resin layer which is provided on a first surface side of the base material layer and which is for temporarily fixing an electronic component, and an adhesive resin layer which is provided on a second surface side of the base material layer and of which the adhesive strength decreases according to an external stimulus, including a specific amount of polyvalent carboxylic acid ester-based plasticizer in the adhesive resin layer on the side to which electronic component is temporarily fixed makes it possible to suppress the glue residue on the electronic component side when peeling the adhesive film from the electronic component, thereby completing the present invention.

According to the present invention, the adhesive film and the method of manufacturing an electronic apparatus illustrated below are provided.

[1]

An adhesive film used when sealing an electronic component with a sealing material in a step of manufacturing an electronic apparatus to temporarily fix the electronic component, the adhesive film including a base material layer, an adhesive resin layer (A) which is provided on a first surface side of the base material layer and which is for temporarily fixing the electronic component, and an adhesive resin layer (B) which is provided on a second surface side of the base material layer and of which adhesive strength decreases according to an external stimulus, in which the adhesive resin layer (A) includes a polyvalent carboxylic acid ester-based plasticizer (X) and an adhesive resin (Y), and a content of the polyvalent carboxylic acid ester-based plasticizer (X) in the adhesive resin layer (A) is more than or equal to 0.7 parts by mass and less than or equal to 50 parts by mass with respect to 100 parts by mass of the adhesive resin (Y) included in the adhesive resin layer (A).

[2]

In the adhesive film according to [1], the polyvalent carboxylic acid ester-based plasticizer (X) includes at least one type selected from a trivalent aromatic carboxylic acid ester-based plasticizer and a tetravalent aromatic carboxylic acid ester-based plasticizer.

[3]

In the adhesive film according to [1] or [2], the polyvalent carboxylic acid ester-based plasticizer (X) includes at least one type selected from a trimellitic acid ester-based plasticizer and a pyromellitic acid ester-based plasticizer.

[4]

In the adhesive film according to any one of [1] to [3], the polyvalent carboxylic acid ester-based plasticizer (X) includes at least one type selected from trimellitic acid trialkyl esters having an alkyl group having 4 to 12 carbon atoms and pyromellitic acid tetraalkyl esters having an alkyl group having 4 to 12 carbon atoms.

[5]

In the adhesive film according to any one of [1] to [4], the adhesive strength of the adhesive resin layer (B) is decreased by heating.

[6]

In the adhesive film according to [5], the adhesive resin layer (B) includes at least one type selected from a gas generating component and heat-expandable microspheres.

[7]

In the adhesive film according to anyone of [1] to [6], a content of at least one type selected from a gas generating component and heat-expandable microspheres in the adhesive resin layer (A) is less than or equal to 0.1% by mass when the entire adhesive resin layer (A) is 100% by mass.

[8]

In the adhesive film according to any one of [1] to [7], the sealing material is an epoxy resin-based sealing material.

[9]

In the adhesive film according to any one of [1] to [8], the adhesive resin layer (A) includes a (meth)acrylic-based adhesive resin.

[10]

In the adhesive film according to any one of [1] to [9], the electronic component is sealed by compression molding using the sealing material.

[11]

A method of manufacturing an electronic apparatus, the method including at least a step (1) of preparing a structural body provided with the adhesive film according to any one of [1] to [10], an electronic component attached to the adhesive resin layer (A) of the adhesive film, and a support substrate attached to the adhesive resin layer (B) of the adhesive film, a step (2) of sealing the electronic component using a sealing material, a step (3) of peeling the support substrate from the structural body by decreasing adhesive strength of the adhesive resin layer (B) by applying an external stimulus, and a step (4) of peeling the adhesive film from the electronic component.

[12]

In the method of manufacturing an electronic apparatus according to [11], the sealing material is an epoxy resin-based sealing material.

[13]

In the method of manufacturing an electronic apparatus according to [11] or [12], the sealing material includes an amine-based curing agent.

[14]

In the method manufacturing an electronic apparatus according to any one of [11] to [13], the sealing material is granular, sheet-like, or liquid.

[15]

In the method of manufacturing an electronic apparatus according to any one of [11] to [14], in step (2), the sealing of the electronic component is performed by compression molding.

Advantageous Effects of Invention

According to the present invention, it is possible to provide an adhesive film for temporarily fixing electronic components which is able to suppress glue residue on the side of the electronic components when peeling an adhesive film from electronic components.

BRIEF DESCRIPTION OF THE DRAWINGS

The objects described above, and other objects, features, and advantages will become more apparent from the preferred embodiments described below and the accompanying drawings below.

DESCRIPTION OF EMBODIMENTS

Figure 1:
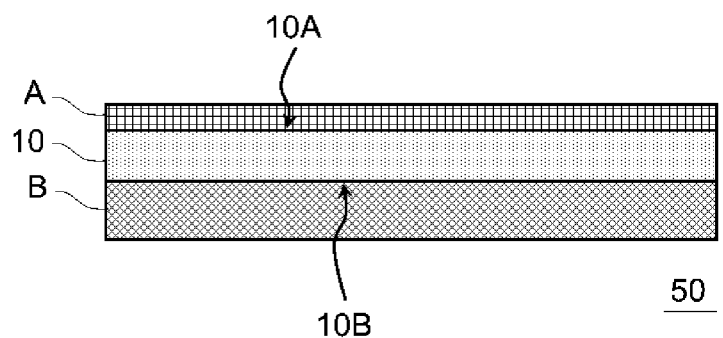
FIG. 1 is a cross-sectional view schematically showing an example of a structure of an adhesive film of an embodiment according to the present invention.

A description will be given below of embodiments of the present invention using the drawings. In all the drawings, the same components are denoted by the same reference numerals and description thereof will not be repeated. In addition, the drawings are schematic views and do not match the actual dimensional ratios. In addition, a numerical range of "A to B" represents more than or equal to A and less than or equal to B unless otherwise specified. In addition, in the present embodiment, "(meth)acrylic" means acrylic, methacrylic, or both acrylic and methacrylic.

1. Adhesive Film for Temporarily Fixing Electronic Components

A description will be given below of an adhesive film 50 according to the present embodiment.

FIG. 1 is a cross-sectional view schematically showing an example of a structure of the adhesive film 50 of an embodiment according to the present invention.

As shown in FIG. 1, the adhesive film 50 according to the present embodiment is an adhesive film used when sealing an electronic component with a sealing material in a step of manufacturing an electronic apparatus to temporarily fix the electronic component, the adhesive film including a base material layer 10, the adhesive resin layer (A) which is provided on a first surface 10A side of the base material layer 10 and which is for temporarily fixing the electronic component, and the adhesive resin layer (B) which is provided on a second surface 10B side of the base material layer 10 and of which the adhesive strength decreases according to an external stimulus. The adhesive resin layer (A) includes the polyvalent carboxylic acid ester-based plasticizer (X) and the adhesive resin (Y), and a content of the polyvalent carboxylic acid ester-based plasticizer (X) in the adhesive resin layer (A) is more than or equal to 0.7 parts by mass and less than or equal to 50 parts by mass with respect to 100 parts by mass of the adhesive resin (Y) included in the adhesive resin layer (A).

As described above, according to the investigations of the present inventors, it was found that, when an electronic component is arranged on an adhesive film, the electronic component is sealed with a sealing material, and then the adhesive film is peeled from the electronic component, glue residue may occur on the electronic component side.

The present inventors carried out further intensive research in order to realize an adhesive film for temporarily fixing electronic components which is able to suppress glue residue occurring on the side of the electronic components when sealing an electronic component with a sealing material in a step of manufacturing an electronic apparatus. As a result, in the adhesive film 50 provided with the base material layer 10, the adhesive resin layer (A) which is provided on the first surface 10A side of the base material layer 10 and which is for temporarily fixing the electronic component, and the adhesive resin layer (B) which is provided on the second surface 10B side of the base material layer 10 and of which the adhesive strength decreases according to an external stimulus, it was found to be effective when the polyvalent carboxylic acid ester-based plasticizer (X) was contained in the adhesive resin layer (A).

As a result of the present inventors carrying out more intensive research based on the above-described findings, it was found for the first time that setting the content of the polyvalent carboxylic acid ester-based plasticizer (X) in the adhesive resin layer (A) to more than or equal to 0.7 parts by mass and less than or equal to 50 parts by mass with respect to 100 parts by mass of the adhesive resin (Y) included in the adhesive resin layer (A) makes it possible to effectively suppress glue residue on the electronic component side when the adhesive film is peeled off from an electronic component.

That is, in the adhesive film 50 according to the present embodiment, setting the content of the polyvalent carboxylic acid ester-based plasticizer (X) in the adhesive resin layer (A) to be in the range described above makes it possible to effectively suppress glue residue on the electronic component side when the adhesive film is peeled off from an electronic component.

In the adhesive film 50 according to the present embodiment, the lower limit of the content of the polyvalent carboxylic acid ester-based plasticizer (X) in the adhesive resin layer (A) is preferably more than or equal to 1.0 part by mass from the viewpoint of effectively suppressing glue residue on the electronic component side when the adhesive film is peeled off from an electronic component.

In the adhesive film 50 according to the present embodiment, the upper limit of the content of the polyvalent carboxylic acid ester-based plasticizer (X) in the adhesive resin layer (A) is preferably less than or equal to 25 parts by mass, more preferably less than or equal to 20 parts by mass, even more preferably less than or equal to 8.0 parts by mass, still more preferably less than or equal to 6.0 parts by mass, and particularly preferably less than or equal to 4.0 parts by mass from the viewpoint of suppressing stains on the electronic components, deterioration in the shear strength of the electronic component, and position shifting in the electronic components during sealing when the adhesive film is peeled off from an electronic component.

In addition, in the adhesive film 50 according to the present embodiment, setting the content of the polyvalent carboxylic acid ester-based plasticizer (X) in the adhesive resin layer (A) to be the more than or equal to lower limit value further improves the affinity of the sealing material to the adhesive film 50 and makes it possible to fill the sealing material in every corner of the mold, and, as a result, it is possible to further suppress sealing unevenness in the electronic components.

The thickness of the entire adhesive film 50 according to the present embodiment is preferably more than or equal to 10 μm and less than or equal to 1000 μm, and more preferably more than or equal to 20 μm and less than or equal to 500 μm from the viewpoint of the balance between mechanical properties and handleability.

It is possible to use the adhesive film 50 according to the present embodiment as a film or the like for temporarily fixing an electronic component in a step of manufacturing an electronic apparatus, and, in particular, favorable use is possible as a film for temporarily fixing an electronic component in a step of manufacturing a fan-out type WLP.

Next, a description will be given of each layer forming the adhesive film 50 according to the present embodiment.

<Base Material Layer>

The base material layer 10 is a layer provided for the purpose of further improving the characteristics such as the handleability, mechanical properties, and heat resistance of the adhesive film 50.

Although the base material layer 10 is not particularly limited, examples thereof include a resin film.

As the resin which forms the resin film described above, it is possible to use a well-known thermoplastic resin. Examples thereof include one type or two or more types selected from polyolefins such as polyethylene, polypropylene, poly(4-methyl-1-pentene), and poly(1-butene); polyesters such as polyethylene terephthalate, polybutylene terephthalate, and polyethylene naphthalate; polyamides such as nylon-6, nylon-66, and polymetaxylene adipamide; polyacrylates; polymethacrylates; polyvinyl chlorides; polyvinylidene chlorides; polyimides; polyetherimides; ethylene-vinyl acetate copolymers; polyacrylonitriles; polycarbonates; polystyrenes; ionomers; polysulfones; polyethersulfones; polyphenylene ether; and the like.

Among these, from the viewpoint of excellent balance between transparency, mechanical strength, cost, and the like, one type or two or more types selected from polypropylene, polyethylene terephthalate, polyethylene naphthalate, polyamide, and polyimide are preferable, and at least one type selected from polyethylene terephthalate and polyethylene naphthalate is more preferable.

The base material layer 10 may be a single layer or may be two or more layers.

In addition, the form of the resin film used in order to form the base material layer 10 may be an extended film and may be a film extended uniaxially or biaxially; however, from the viewpoint of improving the mechanical strength of the base material layer 10, the film is preferably uniaxially or biaxially extended.

From the viewpoint of obtaining good film characteristics, the thickness of the base material layer 10 is preferably more than or equal to 1 μm and less than or equal to 500 μm, more preferably more than or equal to 5 μm and less than or equal to 300 μm, and even more preferably more than or equal to 10 μm and less than or equal to 250 μm.

The base material layer 10 may be subjected to a surface treatment to improve the adhesion property with the other layers. Specifically, a corona treatment, a plasma treatment, an undercoat treatment, a primer coating treatment, and the like may be performed.

<Adhesive Resin Layer (A)>

The adhesive resin layer (A) is provided on one surface of the base material layer 10 and is a layer for temporarily fixing the electronic components in contact with the surface of an electronic component when sealing an electronic component with a sealing material in a step of manufacturing an electronic apparatus.

The adhesive resin layer (A) includes the adhesive resin (Y) and the polyvalent carboxylic acid ester-based plasticizer (X).

Examples of the adhesive resin (Y) include (meth)acrylic-based adhesive resins, silicone-based adhesive resins, urethane-based adhesive resins, olefin-based adhesive resins, styrene-based adhesive resins, and the like. Among these, from the viewpoint of easily adjusting the adhesive strength and the like, (meth)acrylic-based adhesive resins are preferable.

As the adhesive resin layer (A), it is also possible to use a radiation cross-linkable adhesive resin layer of which the adhesive strength is decreased by radiation. Since the radiation cross-linkable adhesive resin layer cross-links upon irradiation with radiation such that the adhesive strength thereof is significantly decreased, the adhesive film 50 is easily peeled off from the electronic component. Examples of radiation include ultraviolet rays, electron beams, infrared rays, and the like. As the radiation cross-linkable adhesive resin layer, an ultraviolet cross-linkable adhesive resin layer is preferable.

Examples of the (meth)acrylic-based adhesive resin used in the adhesive resin layer (A) include a copolymer including a (meth)acrylic acid alkyl ester monomer unit (A) and a monomer unit (B) having a functional group capable of reacting with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin according to the present embodiment, for example, by copolymerizing a monomer mixture including a (meth) acrylic acid alkyl ester monomer (A) and a monomer (B) having a functional group capable of reacting with a cross-linking agent.

Examples of the monomer (A) forming the (meth)acrylic acid alkyl ester monomer unit (A) include (meth)acrylic acid alkyl esters having an alkyl group having approximately 1 to 12 carbon atoms. Preferable examples thereof include (meth)acrylic acid alkyl esters having an alkyl group having 1 to 8 carbon atoms. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or two or more types thereof may be used.

In the (meth)acrylic-based adhesive resin according to the present embodiment, the content of the (meth)acrylic acid alkyl ester monomer unit (A) is preferably more than or equal to 10% by mass and less than or equal to 98.9% by mass when the total of all monomer units in the (meth) acrylic-based adhesive resin is 100% by mass, more preferably more than or equal to 50% by mass and less than or equal to 97% by mass, and even more preferably more than or equal to 85% by mass and less than or equal to 95% by mass.

Examples of the monomer (B) which forms a monomer (B) having a functional group capable of reacting with a cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, and the like. Preferable examples thereof include acrylic acid, methacrylic acid, 2-hydroxyethyl acrylate, 2-hydroxyethyl methacrylate, acrylamide, methacrylamide, and the like. These may be used alone or two or more types thereof may be used.

In the (meth)acrylic-based adhesive resin according to the present embodiment, the content of the monomer unit (B) is preferably more than or equal to 1% by mass and less than or equal to 40% by mass when the total of all monomer units in the (meth)acrylic-based adhesive resin is 100% by mass, more preferably more than or equal to 1% by mass and less than or equal to 20% by mass, and even more preferably more than or equal to 1% by mass and less than or equal to 10% by mass.

The (meth)acrylic-based adhesive resin according to the present embodiment may further contain, as necessary, a monomer unit formed of a monomer having a polymerizable double bond such as vinyl acetate, acrylonitrile, or styrene.

Examples of the polymerization reaction mechanism of the (meth)acrylic-based adhesive resin according to the present embodiment include radical polymerization, anionic polymerization, cationic polymerization, and the like. In consideration of the manufacturing cost of the (meth) acrylic-based adhesive resin, the influence of the functional group of the monomer, the influence of the ions on the electronic component surface, and the like, polymerization by radical polymerization is preferable.

When the polymerization is carried out by radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxydicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetylperoxide, isobutyrylperoxide, octanoylperoxide, t-butylperoxide, and di-t-amylperoxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerization by emulsion polymerization, among these radical polymerization initiators, inorganic peroxides such as water-soluble ammonium persulfate, potassium persulfate, and sodium persulfate; and azo compounds having a carboxyl group in the molecule such as water-soluble 4,4'-azobis-4-cyanovaleric acid are preferable. In consideration of the influence of ions on the electronic component surface, azo compounds having a carboxyl group in the molecule, such as ammonium persulfate or 4,4'-azobis-4-cyanovaleric acid are more preferable, and azo compounds having a carboxyl group in the molecule such as 4,4'-azobis-4-cyanovaleric acid are particularly preferable.

The adhesive resin layer (A) according to the present embodiment preferably further includes a cross-linking agent having two or more cross-linkable functional groups in one molecule in addition to the adhesive resin (Y) and the polyvalent carboxylic acid ester-based plasticizer (X).

The cross-linking agent having two or more cross-linkable functional groups in one molecule is used to react with the functional group of the adhesive resin (Y) to adjust the adhesive strength and aggregation strength.

Examples of such a cross-linking agent include epoxy compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcine diglycidyl ether; isocyanate compounds such as tetramethylene diisocyanate, hexamethylene diisocyanate, toluene diisocyanate triadducts of trimethylolpropane, polyisocyanate, diphenylmethane diisocyanate, and tolylene diisocyanate; aziridine compounds such as trimethylolpropane-tri-β-aziridinyl propionate, tetramethylolmethane-tri-β-aziridinyl propionate, N,N'-diphenylmethane-4,4'-bis(1-aziridine carboxamide), N,N'-hexamethylene-1,6-bis(1-aziridine carboxamide), N,N'-toluene-2,4-bis(1-aziridinecarboxamide), and trimethylolpropane-tri-β-(2-methylaziridine) propionate; tetrafunctional epoxy compounds such as N,N,N',N'-tetraglycidyl-m-xylenediamine, and 1,3-bis(N,N'-diglycidylaminomethyl) cyclohexane; melamine compounds such as hexamethoxymethylolmelamine, and the like. These may be used alone or in a combination of two or more types thereof.

Among these, it is preferable to include one type or two or more types selected from epoxy compounds, isocyanate compounds, and aziridine compounds.

Generally, the content of the cross-linking agent is preferably in a range in which the number of functional groups in the cross-linking agent does not exceed the number of functional groups in the adhesive resin (Y). However, in a case where a functional group is newly generated by the cross-linking reaction, or in a case where the cross-linking reaction is slow, or the like, an excess of functional groups may be contained as necessary.

The content of the cross-linking agent in the adhesive resin layer (A) is preferably more than or equal to 0.1 parts by mass and less than or equal to 15 parts by mass with respect to 100 parts by mass of the adhesive resin (Y) from the viewpoint of improving the balance between the heat resistance and adhesion strength of the adhesive resin layer (A).

The adhesive resin layer (A) according to the present embodiment includes the polyvalent carboxylic acid ester-based plasticizer (X) in addition to the adhesive resin (Y). The polyvalent carboxylic acid ester-based plasticizer (X) preferably includes at least one type selected from a trivalent aromatic carboxylic acid ester-based plasticizer and a tetravalent aromatic carboxylic acid ester-based plasticizer and more preferably includes at least one type selected from trimellitic acid ester-based plasticizers and pyromellitic acid ester-based plasticizers, from the viewpoint of being able to further suppress the glue residue on the electronic component side when peeling the adhesive film from the electronic component.

In addition, from the viewpoint of being able to further suppress the glue residue on the electronic component side when peeling the adhesive film from the electronic component, as the polyvalent carboxylic acid ester-based plasticizer (X), it is preferable to include at least one type selected from a trivalent aromatic carboxylic acid trialkyl ester having an alkyl group having 4 to 12 carbon atoms and a tetravalent aromatic carboxylic acid tetraalkyl ester having an alkyl group having 4 to 12 carbon atoms, and it is more preferable to include at least one type selected from a trimellitic acid trialkyl ester having an alkyl group having 4 to 12 carbon atoms and a pyromellitic acid tetraalkyl ester having an alkyl group having 4 to 12 carbon atoms.

Such trimellitic acid trialkyl esters and pyromellitic acid tetraalkyl esters are esters obtained by an esterification reaction of trimellitic acid or pyromellitic acid with monovalent alcohols (in particular, monovalent aliphatic alcohol). As the monovalent alcohols, monovalent aliphatic alcohols having 4 to 12 carbon atoms (for example, n-butyl alcohol, n-pentyl alcohol, n-hexyl alcohol, n-octyl alcohol, 2-ethylhexyl alcohol, isooctyl alcohol, nonyl alcohol, isononyl alcohol, decyl alcohol, isodecyl alcohol, undecyl alcohol, dodecyl alcohol, and the like) are preferable, and monovalent aliphatic alcohols having 8 to 12 carbon atoms (among these, 8 to 10 carbon atoms, in particular, 8) are more preferable. Monovalent alcohols such as monovalent aliphatic alcohols may be used alone or in a combination of two or more types. The monovalent aliphatic alcohols may have any linear or branched chain form.

Specific examples of trimellitic acid trialkyl esters include trimellitic acid tri (n-octyl), trimellitic acid tri (2-ethylhexyl), trimellitic acid triisooctyl, trimellitic acid triisononyl, trimellitic acid triisodecyl, and the like. Examples of pyromellitic acid tetraalkyl esters include pyromellitic acid tetra(n-octyl), pyromellitic acid tetra(2-ethylhexyl), and the like.

In the present embodiment, the molecular weight of the polyvalent carboxylic acid ester-based plasticizer (X) is not particularly limited, but is preferably more than or equal to 500, more preferably more than or equal to 520, and particularly preferably more than or equal to 540.

The total content of the adhesive resin (Y), the cross-linking agent, and the polyvalent carboxylic acid ester-based plasticizer (X) in the adhesive resin layer (A) is preferably more than or equal to 50% by mass and less than or equal to 100% by mass when the entire adhesive resin layer (A) is 100% by mass, more preferably more than or equal to 70% by mass and less than or equal to 100% by mass, even more preferably more than or equal to 90% by mass and less than or equal to 100% by mass, and particularly preferably more than or equal to 95% by mass and less than or equal to 100% by mass. Due to this, it is possible to further suppress the glue residue on the electronic component side when peeling an adhesive film from an electronic component.

The thickness of the adhesive resin layer (A) is not particularly limited, but, for example, is preferably more than or equal to 1 μm and less than or equal to 100 μm, and more preferably more than or equal to 3 μm and less than or equal to 50 μm.

It is possible to form the adhesive resin layer (A), for example, by coating an adhesive on the base material layer 10. The adhesive may be dissolved in a solvent and coated as a coating solution, may be coated as an aqueous emulsion, or a liquid adhesive may be coated directly.

Among the above, an adhesive coating solution dissolved in an organic solvent is preferable. The organic solvent is not particularly limited and may be appropriately selected from known organic solvents in consideration of solubility and drying time. As organic solvents, it is possible to illustrate esters such as ethyl acetate and methyl acetate; ketones such as acetone and MEK; aromatic solvents such as benzene, toluene, and ethylbenzene; linear or cyclic aliphatic solvents such as heptane, hexane, and cyclohexane; and alcohols such as isopropanol and butanol. Ethyl acetate and toluene are preferable as the organic solvent. These solvents may be used alone or may be used in a mixture of two or more types.

As a method of coating the adhesive coating solution, it is possible to adopt a coating method known in the related art, such as, for example, a roll coating method, a reverse roll coater method, a gravure roll method, a bar coating method, a comma coater method, or a die coater method. The drying conditions of the coated adhesive are not particularly limited; however, in general, drying for 10 seconds to 10 minutes in a temperature range of 80 to 200° C. is preferable. More preferably, the drying is carried out for 15 seconds to 5 minutes at 80 to 170° C. In order to sufficiently promote the cross-linking reaction between the cross-linking agent and the adhesive, heating may be carried out for approximately 5 to 300 hours at 40 to 80° C. after the drying of the adhesive coating solution is completed.

In addition, the base material layer 10 and the adhesive resin layer (A) may be formed by co-extrusion molding, or the film-like base material layer 10 and the film-like adhesive resin layer (A) may be formed by being laminated (lamination).

<Adhesive Resin Layer (B)>

The adhesive film 50 according to the present embodiment is provided with the adhesive resin layer (B) of which the adhesive strength is decreased by an external stimulus on the second surface 10B side on the opposite side to the first surface 10A of the base material layer 10. Due to this, it is possible to easily peel off the adhesive film 50 from a support substrate 80 by applying an external stimulus.

Here, examples of the adhesive resin layer (B) of which the adhesive strength is decreased by an external stimulus include a heat-peelable adhesive resin layer of which the adhesive strength is reduced by heating or a radiation peelable adhesive resin layer of which the adhesive strength is decreased by radiation, and the like. Among the above, a heat-peelable adhesive resin layer of which the adhesive strength is reduced by heating is preferable. Examples of the heat-peelable adhesive resin layer include adhesive resin layers formed of a heat-expandable adhesive including a gas generating component, a heat-expandable adhesive including heat-expandable microspheres capable of expanding to reduce adhesive strength, a heat-expandable adhesive of which the adhesive strength is decreased due to a cross-linking reaction of an adhesive component caused by heat, or the like.

In the present embodiment, the heat-expandable adhesive used for the adhesive resin layer (B) is an adhesive of which the adhesive strength is decreased or lost due to the application of heat. For example, it is possible to select a material which does not peel at 150° C. or lower and which peels at a temperature higher than 150° C., and it is preferable to have adhesive strength of a level such that the adhesive film 50 does not peel off from the support substrate 80 in the step of manufacturing an electronic apparatus.

As a gas generating component used for a heat-expandable adhesive, it is possible to use an azo compound, an azide compound, a Meldrum's acid derivative, or the like. In addition, it is also possible to use inorganic foaming agents such as ammonium carbonate, ammonium hydrogencarbonate, sodium hydrogencarbonate, ammonium nitrite, sodium borohydride, various azides, and water; organic foaming agents such as salts of fluorinated alkane compounds such as trichloromonofluoromethane and dichloromonofluoromethane; azo compounds such as azobisisobutyronitrile, azodicarbonamide, and barium azodicarboxylate; hydrazide compounds such as para-toluenesulfonyl hydrazide, diphenyl sulfone-3,3'-disulfonyl hydrazide, 4,4'-oxybis(benzenesulfonyl hydrazide), and allylbis(sulfonyl hydrazide); semicarbazide compounds such as para-toluylenesulfonyl semicarbazide and 4,4'-oxybis(benzenesulfonyl semicarbazide); triazole compounds such as 5-morpholinyl-1,2,3,4-thiatriazole; and N-nitroso-based compounds such as N,N'-dinitrosopentamethylenetetramine and N,N'-dimethyl-N,N'-dinitrosotephthalamide compounds. The gas generating component may be added to the adhesive resin or may be directly bonded to the adhesive resin.

As the heat-expandable microspheres used for the heat-expandable adhesive, for example, it is possible to use a microencapsulated foaming agent. Examples of such heat-expandable microspheres include microspheres in which a substance which is easily gasified and expanded by heating, such as isobutane, propane, or pentane, is encapsulated in a shell having elasticity. Examples of the material forming the shell include vinylidene chloride-acrylonitrile copolymer, polyvinyl alcohol, polyvinyl butyral, polymethyl methacrylate, polyacrylonitrile, polyvinylidene chloride, polysulfone, and the like. It is possible to manufacture the heat-expandable microspheres, for example, by a coacervation method, an interfacial polymerization method, or the like.

It is possible to add the heat-expandable microspheres to the adhesive resin.

It is possible to appropriately set the content of at least one type selected from the gas generating component and the heat-expandable microspheres according to the expansion ratio, the decrease in the adhesive strength, or the like of the heat-peelable adhesive resin layer (B) and, while not particularly limited, the content is, for example, more than or equal to 1 part by mass and less than or equal to 150 parts by mass with respect to 100 parts by mass of the adhesive resin in the heat-peelable adhesive resin layer (B), preferably more than or equal to 10 parts by mass and less than or equal to 130 parts by mass, and even more preferably more than or equal to 25 parts by mass and less than or equal to 100 parts by mass.

It is preferable to design the temperature at which the gas is generated or the temperature at which the heat-expandable microspheres expand due to heat to be a temperature exceeding 150° C.

Examples of the adhesive resin forming the heat-expandable adhesive include (meth)acrylic resins, urethane resins, silicone resins, polyolefin resins, polyester resins, polyamide resins, fluorine resins, styrene-diene block copolymer type resins and the like. Among the above, (meth)acrylic resins are preferable.

The total content of the adhesive resin, the cross-linking agent, and at least one type selected from the gas generating component and the heat-expandable microspheres in the adhesive resin layer (B) is preferably more than or equal to 50% by mass and less than or equal to 100% by mass when the entire adhesive resin layer (B) is 100%, more preferably more than or equal to 70% by mass and less than or equal to 100% by mass, even more preferably more than or equal to 90% by mass and less than or equal to 100% by mass, and particularly preferably more than or equal to 95% by mass and less than or equal to 100% by mass.

In addition, in the adhesive film 50 according to the present embodiment, when the adhesive strength of the adhesive resin layer (B) is decreased by applying an external stimulus to peel a support substrate from the adhesive resin layer (B), from the viewpoint of stably holding the electronic component on the adhesive resin layer (A), the content of at least one type selected from a gas generating component and heat-expandable microspheres in the adhesive resin layer (A) is preferably less than or equal to 0.1% by mass when the entire resin layer (A) is 100% by mass, more preferably less than or equal to 0.05% by mass, even more preferably less than or equal to 0.01% by mass, and the adhesive resin layer (A) particularly preferably does not include at least one type selected from a gas generating component and heat-expandable microspheres.

The thickness of the adhesive resin layer (B) is not particularly limited, but is, for example, preferably more than or equal to 5 μm and less than or equal to 300 μm, and more preferably more than or equal to 20 μm and less than or equal to 150 μm.

It is possible to form the adhesive resin layer (B), for example, by coating an adhesive coating solution on the base material layer 10.

As a method of coating the adhesive coating solution, it is possible to adopt a coating method known in the related art, for example, roll coating method, a reverse roll coater method, a gravure roll method, a bar coating method, a comma coater method, a die coater method, or the like. The drying conditions of the applied adhesive are not particularly limited; however, in general, drying for 10 seconds to 10 minutes in a temperature range of 80 to 200° C. is preferable. More preferably, the drying is carried out for 15 seconds to 5 minutes at 80 to 170° C. In order to sufficiently promote the cross-linking reaction between the cross-linking agent and the adhesive, heating may be carried out for approximately 5 to 300 hours at 40 to 80° C. after the drying of the adhesive coating solution is completed.

In addition, the base material layer 10 and the adhesive resin layer (B) may be formed by co-extrusion molding, or the film-like base material layer 10 and the film-like adhesive resin layer (B) may be formed by being laminated (lamination).

<Other Layers>

The adhesive film 50 according to the present embodiment may be further provided with, for example, a concavo-convex absorption layer, an impact absorption layer, an easily adhesive layer, and the like between the base material layer 10 and the adhesive resin layer (A), or the base material layer 10 and the adhesive resin layer (B) in a range which does not impair the effect of the present embodiment.

2. Method of Manufacturing Electronic Apparatus

Figure 2:
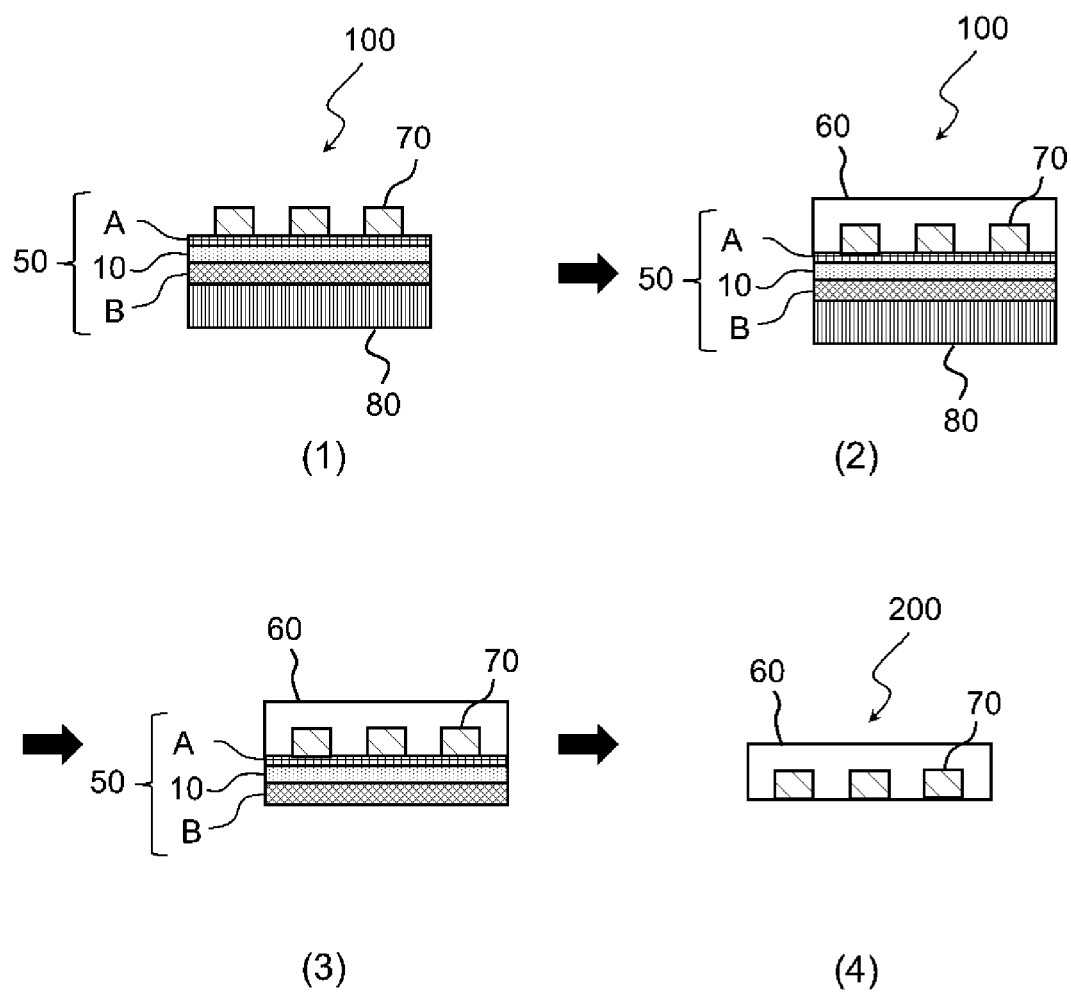
FIG. 2 is a cross-sectional view schematically showing an example of a method of manufacturing an electronic apparatus of an embodiment according to the present invention.
Figure 3:
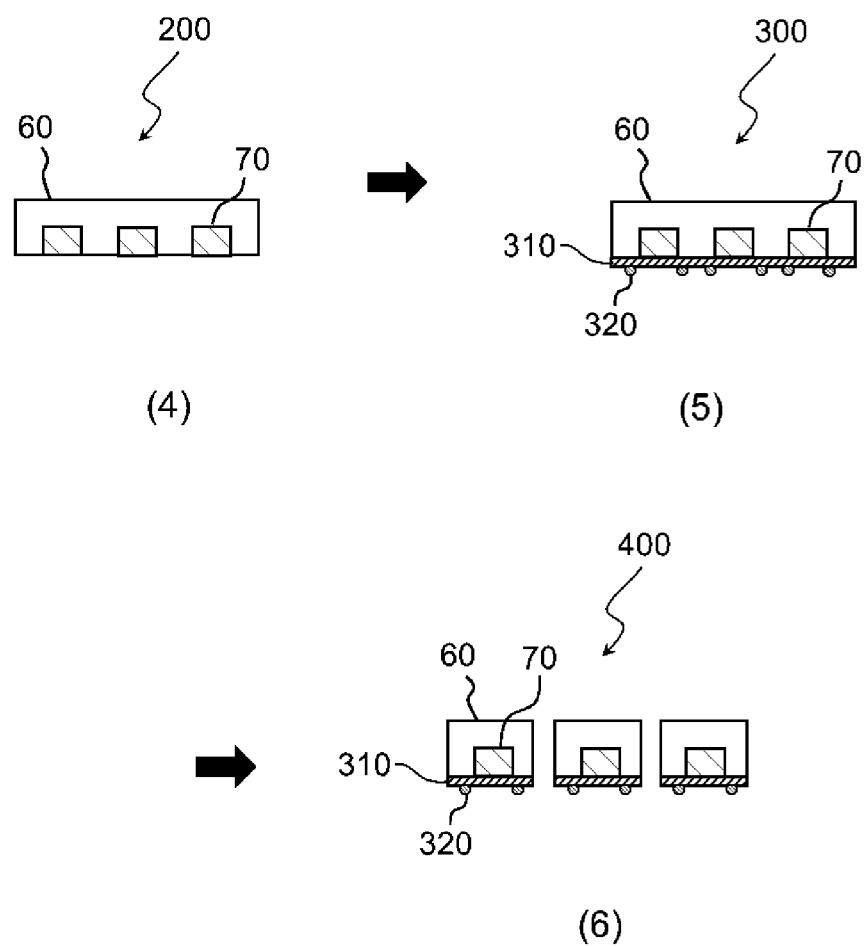
FIG. 3 is a cross-sectional view schematically showing an example of a method of manufacturing an electronic apparatus of an embodiment according to the present invention.

Next, a description will be given of a method of manufacturing the electronic apparatus according to the present embodiment. FIG. 2 and FIG. 3 are cross-sectional views schematically showing an example of a method of manufacturing an electronic apparatus of an embodiment of the present invention.

The method of manufacturing an electronic apparatus according to the present embodiment includes at least the following four steps.

(1) A step of preparing a structural body 100 provided with the adhesive film 50, an electronic component 70 attached to the adhesive resin layer (A) of the adhesive film 50, and the support substrate 80 attached to the adhesive resin layer (B) of the adhesive film 50

(2) A step of sealing the electronic component 70 using a sealing material 60

(3) A step of peeling the support substrate 80 from the structural body 100 by decreasing the adhesive strength of the adhesive resin layer (B) by applying an external stimulus (4) A step of peeling the adhesive film 50 from the electronic component 70

In the manufacturing method of the electronic apparatus according to the present embodiment, as the adhesive film which temporarily fixes the electronic component 70, the adhesive film 50 according to the present embodiment described above is used.

A description will be given below of each step of the method of manufacturing the electronic apparatus according to the present embodiment.

(Step (1))

First, the structural body 100 provided with the adhesive film 50, the electronic component 70 attached to the adhesive resin layer (A) of the adhesive film 50, and the support substrate 80 attached to the adhesive resin layer (B) of the adhesive film 50 is prepared.

It is possible to manufacture the structural body 100, for example, by the following procedure.

First, the adhesive film 50 is attached onto the support substrate 80 such that the adhesive resin layer (B) is on the support substrate 80 side. A protective film may be attached on the adhesive resin layer (B) and it is possible to peel off the protective film and attach the exposed surface of the adhesive resin layer (B) to the surface of the support substrate 80.

As the support substrate 80, it is possible to use, for example, a quartz substrate, a glass substrate, an SUS substrate, or the like.

Subsequently, it is possible to obtain the structural body 100 by arranging the electronic component 70 on the adhesive resin layer (A) of the adhesive film 50 attached on the support substrate 80.

Examples of the electronic component 70 include semiconductor chips such as ICs, LSIs, discrete devices, light emitting diodes, and light receiving elements, semiconductor panels, semiconductor packages, and the like.

(Step (2))

Next, the electronic component 70 is sealed by a sealing material 60.

The electronic component 70 is covered with the sealing material 60, and the sealing material 60 is cured, for example, at a temperature of less than or equal to 150° C. to seal the electronic component 70.

In addition, the form of the sealing material 60 is not particularly limited, and is, for example, granular, sheet-like, or liquid. Here, in a case where the form of the sealing material 60 is granular, the glue of the adhesive film tends to be more likely to remain on the electronic component side. Therefore, when the adhesive film 50 according to the present embodiment is used in a case where the form of the sealing material 60 is granular, it is possible to more effectively suppress the glue residue on the electronic component side when peeling the adhesive film from the electronic component.

The sealing material 60 is not particularly limited; however, for example, it is possible to use an epoxy resin-based sealing material using an epoxy resin.

In particular, a liquid epoxy resin-based sealing material is preferable in terms of the affinity of the sealing material 60 to the adhesive film 50 being further improved and being able to seal the electronic component 70 more evenly.

As such an epoxy resin-based sealing material, for example, it is possible to use the T693/R4000 series, T693/R1000 series, T693/R5000 series, and the like manufactured by Nagase ChemteX Corporation.

In addition, in a case where the epoxy resin-based sealing material includes an amine-based curing agent as a curing agent, the glue of the adhesive film tends to be more likely to remain on the electronic component side. Therefore, when the adhesive film 50 according to the present embodiment is used in a case where the epoxy resin-based sealing material includes an amine-based curing agent as a curing agent, it is possible to more effectively suppress the glue residue on the electronic component side when peeling the adhesive film from the electronic component.

Examples of sealing methods include transfer molding, injection molding, compression molding, cast molding, and the like. After sealing the electronic component 70 with the sealing material 60, the sealing material 60 is cured by, for example, heating at a temperature of less than or equal to 150° C., and the structural body 100 in which the electronic component 70 is sealed is obtained.

Since the adhesive film 50 according to the present embodiment has a good affinity to the sealing material 60, when using the adhesive film 50 as the adhesive film for temporarily fixing the electronic component 70, the resistance during flowing of the sealing material 60 is reduced and it is possible to fill the sealing material 60 in every corner of the mold.

Therefore, by using the adhesive film 50 according to the present embodiment, even in a case where the sealing is performed by compression molding in which filling unevenness of the sealing material is likely to occur, it is possible to suppress sealing unevenness of the electronic component 70. In particular, it is also possible to fill the sealing material 60 into the corners of a square panel shape for which compression molding is difficult and to favorably seal the electronic component 70 even in such a shape.

(Step (3))

Next, the adhesive strength of the adhesive resin layer (B) is decreased by applying an external stimulus, and the support substrate 80 is peeled off from the structural body 100.

It is possible to easily remove the support substrate 80 from the adhesive film 50 by, for example, heating the temperature to more than 150° C. after sealing the electronic component 70 to decrease the adhesive strength of the adhesive resin layer (B).

(Step (4))

Next, the adhesive film 50 is removed from the electronic component 70 to obtain an electronic apparatus 200.

Examples of methods of removing the adhesive film 50 from the electronic component 70 include a method in which peeling is carried out mechanically, a method which peeling is carried out by decreasing the adhesive strength of the surface of the adhesive film 50, and the like.

(Step (5))

In the method of manufacturing the electronic apparatus according to the present embodiment, as shown in FIG. 3, a step (5) of obtaining an electronic apparatus 300 by forming a wiring layer 310 and bumps 320 on the exposed surface of the obtained electronic apparatus 200 may be further provided.

The wiring layer 310 is provided with a pad (not shown), which is an external connection terminal formed on the outermost surface, and wiring (not shown) electrically connecting the exposed electronic component 70 and the pad. It is possible to form the wiring layer 310 by a method known in the related art and the wiring layer 310 may have a multilayer structure.

It is possible to form the bumps 320 on the pad of the wiring layer 310 to obtain the electronic apparatus 300. Examples of the bumps 320 include solder bumps and gold bumps. It is possible to form the solder bumps, for example, by arranging solder balls on the pad which is the external connection terminal of the wiring layer 310 and carrying out heating to melt (reflow) the solder. It is possible to form the gold bumps by a method such as a ball bonding method, a plating method, or an Au ball transfer method.

(Step (6))

The method of manufacturing an electronic apparatus according to the present embodiment may be further provided with a step (6) of dicing the electronic apparatus 300 to obtain a plurality of electronic apparatuses 400, as shown in FIG. 3.

It is possible to perform the dicing of the electronic apparatus 300 by a known method.

Although embodiments of the present invention were described above, these are illustrations of the present invention and it is also possible to adopt various structures other than the above.

The present invention is not limited to the embodiments described above, and modifications, improvements, and the like are included in the present invention in a range in which it is possible to achieve the object of the present invention.

EXAMPLES

Hereinafter, a detailed description will be given of the present invention using Examples, but the present invention is not limited thereto.

The details of the materials used for manufacturing the adhesive film are as follows.

<Adhesive Resin Solution 1>

0.266 parts by mass of t-butylperoxy-2-ethylhexanoate (manufactured by NOF Corporation, trade name: Perbutyl O (registered trademark)) as a polymerization initiator, 72 parts by mass of n-butyl acrylate as monomer (A), 18 parts by mass of methyl methacrylate, 7 parts by mass of 2-hydroxyethyl methacrylate as monomer (B), and 3 parts by mass of acrylic acid were each added to a mixed solvent including ethyl acetate and toluene, and the solution was polymerized while stirring at 83 to 87° C. for 11 hours to obtain an acrylic resin solution having a solid concentration of 45% by mass. This was used as an adhesive resin solution 1.

<Adhesive Coating Solution 1>

100 parts by mass of the adhesive resin solution 1 and 0.9 parts by mass of 1,3-bis(N,N'-diglycidylaminomethyl)cyclohexane (manufactured by Mitsubishi Gas Chemical Co., Ltd., solid concentration 100%, Tetrad-C) which is a cross-linking agent were each mixed, and the solid content concentration was adjusted to 30% with ethyl acetate to obtain an adhesive coating solution 1.

<Adhesive Coating Solutions 2 to 7>

100 parts by mass of the adhesive resin solution 1, 0.9 parts by mass of 1,3-bis(N,N'-diglycidylaminomethyl)cyclohexane (manufactured by Mitsubishi Gas Chemical Co., Ltd., solid concentration 100%, Tetrad-C) which is a cross-linking agent, and 0.225 to 13.5 parts by mass of trimellitic acid tri(2-ethylhexyl) (manufactured by Adeka Corporation, Adeka Cizer C8, molecular weight: 546.79) as a plasticizer were each mixed, and the solid content concentration was adjusted to 30% with ethyl acetate to obtain adhesive coating solutions 2 to 7, respectively.

<Adhesive Resin Solution for Forming Adhesive Resin Layer (B)>

100 parts by mass of the adhesive resin solution 1, 0.9 parts by mass (2 parts by mass with respect to 100 parts by mass of adhesive resin) of 1,3-bis(N,N'-diglycidylaminomethyl) cyclohexane (manufactured by Mitsubishi Gas Chemical Co., Ltd., solid concentration 100%, Tetrad-C) which is a cross-linking agent, and 9 parts by mass (20 parts by mass with respect to 100 parts by mass of adhesive resin) of heat-expandable microspheres (manufactured by Matsumoto Yushi Seiyaku Co., Ltd., trade name "Matsumoto Microspheres FN-180SSD" were each mixed, and the solid content concentration was adjusted to 30% with ethyl acetate to prepare an adhesive coating solution.

Comparative Example 1

The adhesive coating solution 1 was coated onto a polyethylene terephthalate (PET) film (thickness 38 μm) which is a base material layer, and then dried to form an adhesive resin layer (A) with a thickness of 15 μm. Next, an adhesive resin solution for forming the adhesive resin layer (B) was coated on the surface of the PET film on the opposite side to the adhesive resin layer (A), and then dried to form the heat-peelable type adhesive resin layer (B) with a thickness of 45 μm and obtain an adhesive film.

The following evaluation was performed with regard to the obtained adhesive film.

The obtained results are shown in Table 1.

Comparative Example 2 and Examples 1 to 5

Adhesive films of Comparative Example 2 and Examples 1 to 5 were obtained in the same manner as in Comparative Example 1 except that adhesive coating solutions 2 to 7 were used instead of the adhesive coating solution 1, respectively.

The following evaluations were performed with regard to the obtained adhesive films, respectively. The obtained results are shown in Table 1, respectively.

EVALUATION (1) Peeling strength of adhesive film with respect to sealing layer

The adhesive resin layer (B) side of the adhesive film was adhered on a 100 mm square SUS substrate and the 5 mm square semiconductor chips were placed and adhered on top of the adhesive resin layer (A) of the adhesive film in a lattice shape of 5 mm intervals to obtain a structural body.

Next, a predetermined amount of an epoxy resin-based sealing material (G730 manufactured by Sumitomo Bakelite Co., Ltd.) was measured and dispersed in a range of less than or equal to ϕ75 mm on the entirety of the adhesive resin layer (A) on which the semiconductor chips were arranged.

Next, a mold with a circular shape of ϕ80 mm punched out was prepared, and the structural body in which the epoxy resin-based sealing material was dispersed was arranged in the mold such that the semiconductor chips did not overlap, 300 kg of pressure was applied thereto with a press under conditions of 120 to 130° C. and heating was carried out for 400 seconds. Thereafter, the SUS substrate on which the sealing layer formed of the epoxy resin-based sealing material was formed was treated at 150° C. for 30 minutes to perform post mold curing.

Next, the SUS substrate was heated on a hot plate at 190° C. to expand the adhesive resin layer (B) so as to peel the adhesive film from the SUS substrate.

Next, the adhesive film was cut to a width of 50 mm and the peel strength (25 mm width conversion) of the adhesive film was measured with respect to the sealing layer formed of an epoxy resin-based sealing material under the conditions of 150° C., a peeling speed of 100 mm/min, and a peeling angle of 180° in a thermostat-equipped tensile tester.

(2) Glue Residue

After the evaluation of the peel strength of the adhesive film with respect to the sealing layer, the glue residue of the adhesive film on the peeling surface on the semiconductor chip side was visually observed and the glue residue of the adhesive film was evaluated based on the following criteria.

○: Glue residue was not observed on the peeling surface on the semiconductor chip side by visual observation X: Glue residue was observed on the peeling surface on the semiconductor chip side by visual observation (3) Degree of Contamination of Semiconductor Chips After the evaluation of the peel strength of the adhesive film with respect to the sealing layer, the contamination state (stains) of the surface of the semiconductor chip was visually observed and the degree of contamination of the semiconductor chip was evaluated based on the following criteria.

A: No stains at all were observed on the semiconductor chip by visual observation B: A few stains were observed on a part of the surface of the semiconductor chip by visual observation C: Stains were observed on the entire surface of the semiconductor chip by visual observation

TABLE 1

| | Content of plasticizer (X) in resin layer (A) [parts by mass] | Peeling strength of adhesive film with respect to sealing layer [N/25 mm] | Glue residue | Degree of contamination of semiconductor chip |
|---|---|---|---|---|
| Example 1 | 1.0 | 0.15 | ○ | A |
| Example 2 | 4.0 | 0.09 | ○ | A |
| Example 3 | 10 | 0.10 | ○ | B |
| Example 4 | 20 | 0.10 | ○ | B |
| Example 5 | 30 | 0.07 | ○ | C |
| Comparative Example 1 | 0 | 0.34 | x | B |
| Comparative Example 2 | 0.5 | 0.30 | x | A |

In Examples 1 to 5 using the adhesive film in which the content of the polyvalent carboxylic acid ester-based plasticizer (X) in the adhesive resin layer (A) was more than or equal to 0.7 parts by mass and less than or equal to 50 parts by mass with respect to 100 parts by mass of the adhesive resin (Y) included in the adhesive resin layer (A), no glue residue was observed on the peeling surface on the semiconductor chip side. Thus, it is understood that, with the adhesive films of Examples 1 to 5, it is possible to suppress the generation of glue residue on the electronic component side when peeling the adhesive film from the electronic component.

On the other hand, in Comparative Examples 1 and 2 in which an adhesive film was used in which the content of the polyvalent carboxylic acid ester-based plasticizer (X) in the adhesive resin layer (A) was less than 0.7 parts by mass with respect to 100 parts by mass of the adhesive resin (Y) included in the adhesive resin layer (A), glue residue was observed on the peeling surface on the semiconductor chip side.

Thus, it is understood that, with the adhesive films of Comparative Examples 1 and 2, glue residue occurs on the electronic component side when peeling the adhesive film from the electronic component.

This application claims priority based on Japanese Patent Application No. 2017-008618 filed on Jan. 20, 2017, the entire disclosure of which is incorporated herein.

The invention claimed is:

1. A method of manufacturing an electronic apparatus, the method comprising at least:
    a step (1) of preparing a structural body provided with an adhesive film, an electronic component attached to an adhesive resin layer (A) of the adhesive film, and a support substrate attached to an adhesive resin layer (B) of the adhesive film;
    a step (2) of sealing the electronic component using a sealing material;
    a step (3) of peeling the support substrate from the structural body by decreasing adhesive strength of the adhesive resin layer (B) by applying an external stimulus; and a step (4) of peeling the adhesive film from the electronic component, wherein the adhesive film comprises:

a base material layer;

the adhesive resin layer (A) which is provided on a first surface side of the base material layer and which is for temporarily fixing the electronic component; and the adhesive resin layer (B) which is provided on a second surface side of the base material layer and of which adhesive strength decreases according to an external stimulus, wherein the adhesive resin layer (A) includes a polyvalent carboxylic acid ester-based plasticizer (X) and an adhesive resin (Y), and a content of the polyvalent carboxylic acid ester-based plasticizer (X) in the adhesive resin layer (A) is more than or equal to 0.7 parts by mass and less than or equal to 50 parts by mass with respect to 100 parts by mass of the adhesive resin (Y) included in the adhesive resin layer (A).

2. The method of manufacturing an electronic apparatus according to claim 1, wherein the sealing material is an epoxy resin-based sealing material.

3. The method of manufacturing an electronic apparatus according to claim 1, wherein the sealing material includes an amine-based curing agent.

4. The method of manufacturing an electronic apparatus according to claim 1, wherein the sealing material is granular, sheet-like, or liquid.

5. The method of manufacturing an electronic apparatus according to claim 1, wherein, in step (2), the sealing of the electronic component is performed by compression molding.

* * * * *